United States Patent [19]

Tajima et al.

[11] Patent Number: 4,709,410
[45] Date of Patent: Nov. 24, 1987

[54] FREQUENCY CONVERSION CIRCUITS

[75] Inventors: Yusuke Tajima, Acton; Robert A. Pucel, Needham, both of Mass.

[73] Assignee: Raytheon Company, Lexington, Mass.

[21] Appl. No.: 723,377

[22] Filed: Apr. 15, 1985

[51] Int. Cl.[4] .............................................. H04B 1/28
[52] U.S. Cl. .................................... 455/333; 455/323; 455/325; 455/326; 333/138
[58] Field of Search ............... 455/323, 325, 326, 333; 333/138

[56] References Cited

U.S. PATENT DOCUMENTS 3,817,582  6/1974  Green et al. ..................... 333/138
4,291,286 12/1979  Wagner.
4,662,000  4/1987  Tajima et al. ..................... 455/333

FOREIGN PATENT DOCUMENTS 857745 10/1959 United Kingdom.

OTHER PUBLICATIONS

"Dual-Gate MESFET Mixers" by Christos Tsironis, Roman Meierer and Rainer Stahlmann, IEEE Transactions on Microwave Theory and Techniques, vol. MTT-32, No. 3, Mar. 1984.
"Modelling and Analysis of Dual-Gate MESFET Mixers" by H. Ashoka and R. S. Tucker, Department of Electrical Engineering, University of Queensland, St. Lucia, 4067, Australia, Jan. 16, 1984.
"Balanced and Double-Balanced Mixers" pp. 113–127, Anaren Catalog.
"How to Talk Mixers" by Dr. J. F. Reynolds and M. R. Rosenzweig, Microwaves, vol. 17, No. 5, May 1978, pp. 1–19.
"A Microwave Distributed MESFET Mixer" by O.S.A. Tang et al., IEE Colloquium on Multi-Octave Microwave Components—Active and Passive, London, England, Apr., 1984, pp. 483–487.

Primary Examiner—Jin F. Ng
Assistant Examiner—Elissa Seidenglanz
Attorney, Agent, or Firm—Denis G. Maloney; Richard M. Sharkansky

[57] ABSTRACT

A radio frequency circuit having at least one output terminal includes a plurality of non-linear elements, each having an output electrode. Means are provided for feeding at least one input signal to each one of the non-linear elements. The feeding means includes an electrical pathlength including at least one two port phase shifting element fed by at least the input signal, for providing a plurality of signal portions, each one fed to a corresponding one of the plurality of non-linear elements. These signal portions have a successively increasing phase shift related to the electrical pathlength of the two port phase shifting elements. The output electrodes of each non-linear element are interconnected by an input coupling means including at least one, different, two port phase shifting element, for successively electrically interconnecting the output electrode of each non-linear element. With such an arrangement, by providing two port phase shift elements in the input and output coupling means, proper phasing characteristics may be provided to such circuits without the necessity of using couplers or baluns which are generally difficult to fabricate, particularly, as broadband monolithic microwave integrated circuits.

9 Claims, 16 Drawing Figures

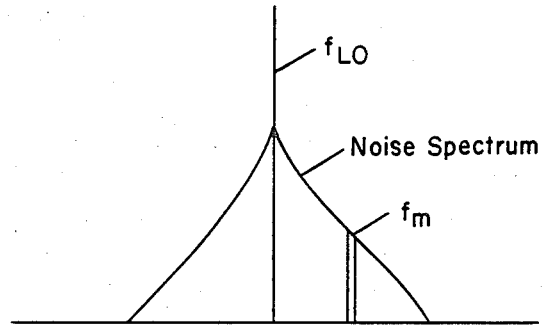
FIG. 7
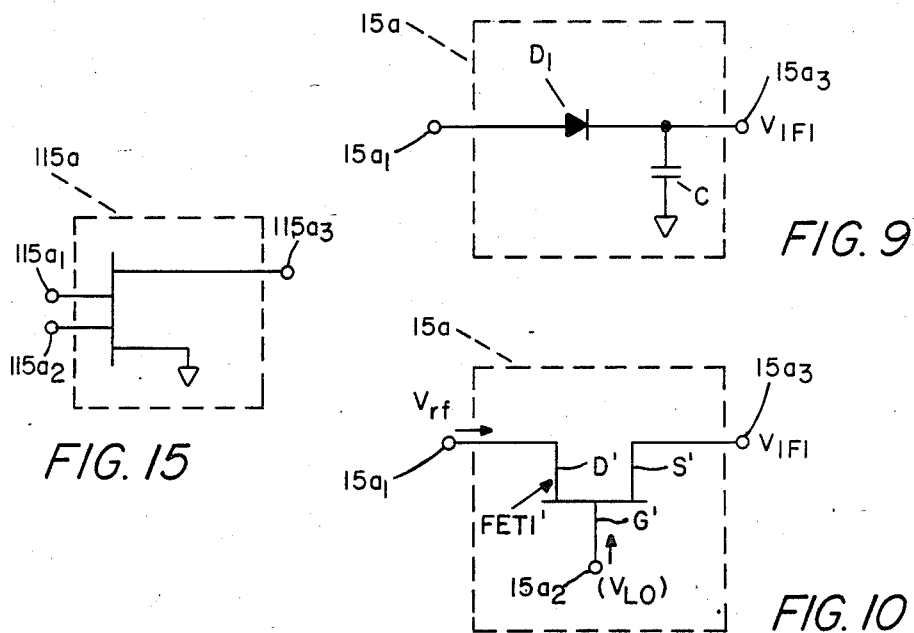
FIG. 15
FIG. 9
FIG. 10
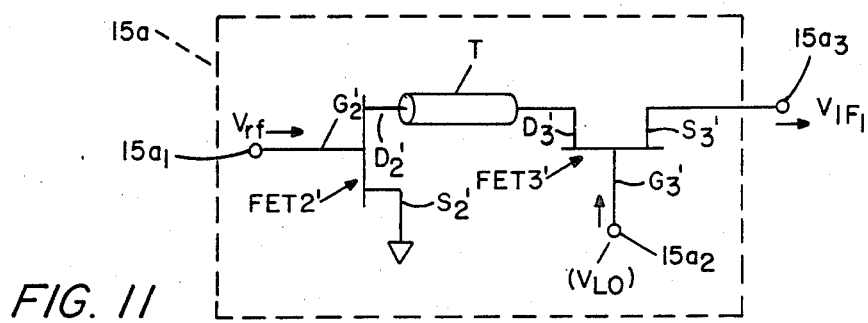
FIG. 11

FREQUENCY CONVERSION CIRCUITS

BACKGROUND OF THE INVENTION

This invention relates generally to radio frequency circuits and more particularly to frequency conversion circuits.

As is known in the art, frequency conversion circuits provide an output signal in response to at least one input signal having desired frequency components which are related to the frequency of the input signal. Generally, if the desired frequency components of the output signal are lower than that of the frequency of the input signal, the circuit is called a mixer or down converter. If the desired frequency components are higher than the frequency of the input signal, the circuit is called an up converter or multiplier. In either case, at least an input is fed to a non-linear device and the non-linear device either converts a portion of the input signal into a harmonic of the original input signal or the input signal is mixed with a second input signal to provide the output signal having the desired frequency components.

One problem with such circuits is that the non-linear element also generates in response to the input signal undesired frequency components. Typically, these frequency components are eliminated by filtering or phasing techniques. Filtering techniques although relatively straightforward are inadequate in applications when the bandwidth of the desired input frequency overlaps the bandwidth of the undesired input frequencies. In such cases, phasing techniques are generally used. One problem with phasing techniques is that generally couplers or baluns are used to provide a phase relationship between the signals. Couplers or baluns are in general narrowband devices, in particular, when fabricated as an integrated circuit. Moreover, such couplers or baluns are generally difficult to fabricate as integrated circuits. Accordingly, frequency conversion circuits are generally difficult to fabricate as integrated circuits, particularly, when phasing techniques are desired to be employed.

SUMMARY OF THE INVENTION

In accordance with the present invention, a radio frequency circuit having at least one output terminal includes a plurality of non-linear elements, each having an output electrode. Means are provided for feeding at least one input signal to each one of said non-linear elements. The feeding means includes means having an electrical pathlength including at least one two port phase shifting element fed by at least the input signal, for providing a plurality of signal portions, each one fed to a corresponding one of said plurality of non-linear elements, said signal portions having a successively increasing phase shift related to the electrical pathlength of the two port phase shifting elements. The output electrodes of each non-linear element are interconnected by an input coupling means including at least one, different, two port phase shifting element, for successively electrically interconnecting the output electrode of each non-linear element. With such an arrangement, by providing two port phase shift elements in the input and output coupling means, proper phasing characteristics may be provided to such circuits without the necessity of using couplers or baluns which are generally difficult to fabricate, particularly, as broadband monolithic microwave integrated circuits.

BRIEF DESCRIPTION OF THE DRAWINGS

The foregoing features of this invention, as well as the invention itself, may be more fully understood from the following detailed description of the drawings, in which:

FIG. 7 is a typical noise spectrum produced by a local oscillator frequency signal;

FIGS. 9-11 are schematic diagrams for alternate embodiments of non-linear elements for use with the circuits described in conjunction with FIGS. 1 and 8;

FIG. 15 is a schematic diagram for an alternate embodiment of the non-linear elements for use with the circuit of FIG. 14.

DESCRIPTION OF THE PREFERRED EMBODIMENTS

Figure 1:
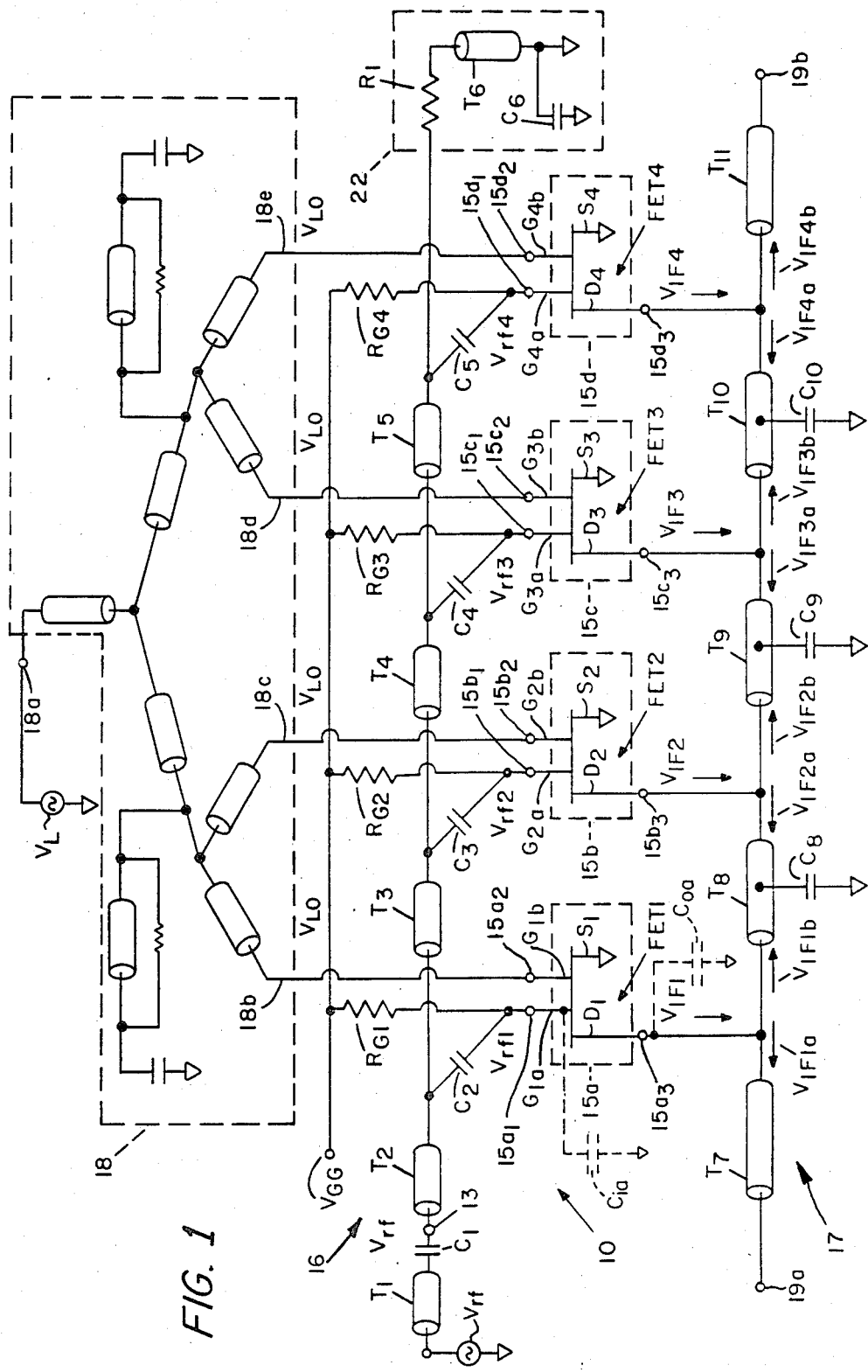
FIG. 1 is a schematic diagram of a frequency conversion circuit, here a mixer circuit.

Referring now to FIG. 1, a frequency conversion circuit, here a mixer circuit 10 is shown to include a plurality of here four non-linear elements $15a$-$15d$, each one having input electrodes $15a_1$-$15d_1$, $15a_2$-$15d_2$ and output electrodes $15a_3$-$15d_3$. Here each non-linear element $15a$-$15d$ includes a dual-gate field effect transistor FET 1-FET 4, biased to operate as a non-linear device, for example FET 1-FET 4, may be biased to operate as a half wave vth law device such as a half wave square law device. Each FET 1-FET 4 is successively coupled between an input terminal 13, and a pair of output terminals 19a, 19b, and have first gate electrodes $G_{1a}$-$G_{4a}$, second gate electrodes $G_{1b}$-$G_{4b}$, drain electrodes $D_1$-$D_4$ connected to respective electrodes of non-linear elements $15a$-$15d$, respectively, as shown, and source electrodes $S_1$-$S_4$. A transmission line $T_1$, here a microstrip transmission line, is coupled at a first end to the input terminal 13 via a d.c. blocking capacitor $C_1$ and a second end to an RF signal source 11. First gate electrodes $G_{1a}$-$G_{4a}$ are shown successively interconnected together by input coupling means 16, here a traveling wave structure comprising a plurality of two port phase shift elements such as an artificial line or a distributed line. Here the two port elements comprise a plurality of distributed transmission lines $T_2$-$T_5$, here each distributed transmission line $T_2$-$T_5$ being a microstrip transmission line. Transmission line $T_5$ is coupled at a first end to transmission line $T_4$ and at a second end to a gate line termination matching network 22. Transmission line $T_1$ is fed an input signal ($V_{rf}$) which propagates along transmission lines $T_1$-$T_5$. Selected portions $V_{rf1}$-$V_{rf4}$ of input signal $V_{rf}$ are coupled to respective gate electrodes $G_{1a}$-$G_{4a}$ preferably through a plurality of coupling capacitors $C_2$-$C_5$. Each transmission line $T_2$-$T_5$ has a selected impedance and length to provide in combination with coupling capacitors $C_2$-$C_5$ a predetermined phase shift with respect to signal $V_{rf}$ to each signal portion $V_{rf1}$-$V_{rf4}$ of the input signal $V_{rf}$. The coupling capacitors $C_2$-$C_5$ in addition to contributing to the phase shift characteristics imparted to the signals $V_{rf1}$-$V_{rf4}$ also provide in combination with the intrinsic capacitance (not shown) between gates $G_{1a}$-$G_{4a}$ and source electrodes $S_1$-$S_4$ input signals having predetermined amplitudes. Suffice it here to say that the impedance and length of transmission lines $T_2$-$T_5$ and capacitance of coupling capacitors $C_2$-$C_5$ are selected to provide predetermined phase and amplitude relationships to input signals $V_{rf1}$-$V_{rf4}$.

Second gate electrodes $G_{2a}$-$G_{2d}$ are each fed a second input signal, here an in-phase equal amplitude signal from a common signal source $V_L$. Signal source $V_L$ feeds an input terminal 18a to a power divider circuit 18 which provides four equal amplitude in-phase signals $V_{LO}$ (herein referred to as a local oscillator signal) at ports 18b-18e.

Drain electrodes $D_1$-$D_4$ are successively interconnected together by a second, here output or drain coupling means 17, here a traveling wave structure with said output coupling means 17 comprising a plurality of two port phase shifting elements such as an artificial line or a plurality of distributed transmission lines $T_7$-$T_{11}$ and a plurality of capacitors $C_8$-$C_{10}$, as shown. The transmission lines $T_8$-$T_{10}$ are here mutually coupled microstrip transmission lines. The mutual coupling of the transmission lines $T_8$-$T_{10}$, and capacitors $C_8$-$C_{10}$ here provide the phase shifting elements having electrical pathlengths to provide the requisite phase shift at the frequency of the IF signals. Alternatively, artificial lines comprising a plurality of lumped inductors and capacitors may be used. The particular choice of construction for the phase shift elements for either coupling means 16 or 17 is determined in accordance with the frequency characteristic of signals which propagate through such coupling means 16, 17.

The mixer circuit 10 is shown to further include the gate line termination network 22 coupled to transmission line $T_5$, including a resistor $R_1$, capacitor $C_6$, and a transmission line $T_6$, as shown. A direct current path (DC path) to couple a gate bias source $V_{GG}$ to gates $G_{1a}$-$G_{1d}$ is provided through resistors $R_{G1}$-$R_{G4}$, as shown. Drain bias is here provided by an external biasing arrangement (not shown).

In operation, input signal portion $V_{rf1}$ is coupled to gate electrode $G_{1a}$ through coupling capacitor $C_2$. As previously mentioned, capacitor $C_2$ has a capacitance selected in accordance with the inherent or intrinsic capacitance (not shown) of FET 1 to provide a voltage divider and hence to provide a selected amplitude to signal $V_{rf2}$. Succeeding portions $V_{rf2}$-$V_{rf4}$ of the input signal $V_{rf}$ are coupled to gate electrodes $G_{2a}$ $G_{4a}$ through coupling capacitors $C_3$-$C_5$. In a similar manner, capacitors $C_3$-$C_5$ each have a capacitance selected in accordance with the intrinsic gate-source capacitance of FET 2-FET 4, respectively, to provide signals coupled to said gate electrodes having a selected or tailored amplitude. Each one of said signals $V_{rf}$-$V_{rf4}$ has a predetermined electrical phase shift related to the number of transmission line sections through which the signal propagates beyond transmission line $T_2$, as well as, the capacitance of the respective coupling capacitors.

Local oscillator signals $V'_{LO}$ here of equal amplitude and equal phase are fed to the second gate electrodes $G_{1b}$-$G_{4b}$ and in combination with signals $V_{rf2}$-$V_{rf4}$ produce output signals $V_{IF1}$-$V_{IF4}$ at drain electrodes $D_1$-$D_4$. The output signals $V_{IF1}$-$V_{IF4}$ each include frequency components corresponding to the sum frequency ($\omega_{rf} + \omega_{LO}$), the difference frequency $|\omega_{RF} - \omega_{LO}|$, as well as, the frequencies of the original signals $\omega_{rf}$, $\omega_{LO}$, harmonics of the input signal $N\omega_{rf}$ and the local oscillator signal $M\omega_{LO}$, as well as, intermodulation products of the components ($N\omega_{rf} \pm M\omega_{LO}$). Here the output coupling means comprising transmission lines $T_7$-$T_{11}$ has characteristics selected to support propagation of the difference frequency signal $|\omega_{rf} - \omega_{LO}|$, and preferably, filters or blocks the frequency components of the RF signal, the local oscillator signal, the sum frequency component, the intermodulation products, the harmonics of the local oscillator frequency signal, and the harmonics of the radio frequency signal.

For the case where the input signal $V_{rf}$ has a frequency $\omega_{rf}$ less than the frequency $\omega_{LO}$ of the local oscillator signal, at a first one of the pair of terminals 19a, 19b, here terminal 19a, will be provided the intermediate frequency signal having a frequency corresponding to $\omega_{IF} = \omega_{LO} - \omega_{rf}$, with the second one of said pair of terminals 19a, 19b, here terminal 19b providing a null or attenuated signal. For the second case, where the frequency of input signal $\omega_{RF}$ is greater than the frequency $\omega_{LO}$ of the local oscillator signal, at the second output terminal terminal 19b will be provided an intermediate frequency signal having a frequency corresponding to $\omega_{IF} = \omega_{rf} - \omega_{LO}$ and at terminal 19a will be provided a null or attenuated signal. With this arrangement, the radio frequency mixer discriminates between radio frequency signals having a frequency either above or below that of the local oscillator signal. That is, the mixer discriminates between the desired signal and the image signal.

The following discussion and accompanying Table 1 are useful in understanding how the mixer circuit 10 discriminates between the desired IF signal and image IF signal.

TABLE I

| | $\omega_{rf} > \omega_{LO}$ | | | | $\omega_{rf} < \omega_{LO}$ | | | |
|---|---|---|---|---|---|---|---|---|
| FET | $\omega_{rf}$ | phase shift | IF freq. | phase shift | $\omega_{rf}$ | phase shift | IF freq. | phase shift |
| 1 | $\omega_{LO} + \omega_{IF}$ | 0 | $\omega_{IF}$ | 0 | $\omega_{LO} - \omega_{if}$ | 0 | $\omega_{IF}$ | 0 |
| 2 | $\omega_{LO} + \omega_{IF}$ | $\theta$ | $\omega_{IF}$ | $\theta$ | $\omega_{LO} - \omega_{if}$ | $\theta$ | $\omega_{IF}$ | $-\theta$ |
| 3 | $\omega_{LO} + \omega_{IF}$ | $2\theta$ | $\omega_{IF}$ | $2\theta$ | $\omega_{LO} - \omega_{if}$ | $2\theta$ | $\omega_{IF}$ | $-2\theta$ |

TABLE I-continued

| | $\omega_{rf} > \omega_{LO}$ | | | | $\omega_{rf} < \omega_{LO}$ | | | |
|---|---|---|---|---|---|---|---|---|
| FET | $\omega_{rf}$ | phase shift | IF freq. | phase shift | $\omega_{rf}$ | phase shift | IF freq. | phase shift |
| 4 | $\omega_{LO} + \omega_{IF}$ | $3\theta$ | $\omega_{IF}$ | $3\theta$ | $\omega_{LO} - \omega_{if}$ | $3\theta$ | $\omega_{IF}$ | $-3\theta$ |

As an illustrative example, consider the case where each one of lines $T_3$-$T_5$ and $T_8$-$T_{10}$ provide phase shifts of $\theta_{rf}$ and $\theta_{IF}$, respectively, where $\theta_{rf}$ and $\theta_{IF}$ are the same phase shift equal to 90° at the respective rf and IF frequencies where this condition is satisfied, where the phase shift contribution of the FETS, as well as, the capacitors can be ignored, and where $C_2 = C_3 = C_4 = C_5 = \infty$.

Over a narrow frequency band, for $\omega_{rf} < \omega_{LO}$, signals $V_{1a}$-$V_{4a}$ will substantially add in-phase at terminal 19a and will provide substantially a null or attenuated signal at terminal 19b. Similarly, over a narrow band where $\omega_{rf} > \omega_{LO}$, signals $V_{1b}$-$V_{4b}$ will add in-phase at terminal 19b and will provide a null or attenuated signal at terminal 19a.

This may be demonstrated as follows: $V_{rf1}$ has a relative phase shift of 0° with respect to itself and thus $V_{IF1}$ similarly has a relative phase shift of 0°. Thus, signal component $V_{IF1a}$ has a phase shift of 0° at terminal 19a, whereas signal component $V_{IF1b}$ has a phase shift of $3\theta_{IF}$ at terminal 19b. The intermediate signal $V_{IF2}$ has a phase shift relative to $V_{IF1}$ corresponding to $\theta_{rf}$. Signal component $V_{IF2a}$ which propagates toward terminal 19a has a composite phase shift of $\theta_{rf} + \theta_{IF} = 2\theta$ and the signal component $V_{IF2b}$ which propagates toward terminal 19b has a composite phase shift of $\theta_{rf} + 2\theta_{IF} = 3\theta$. Thus, at terminal 19a signal component $V_{IF2a}$ in combination with the signal component $V_{IF1a}$ provides a null or strongly attenuated signal since components $V_{IF1a}$, $V_{IF2a}$ are substantially of equal magnitude and 180° out-of-phase (as assumed $\theta = 90°$). The second signal component $V_{2b}$ combines in-phase at terminal 19b with signal $V_{IF1b}$. Similarly, the intermediate signal $V_{IF3}$ has a phase of $2\theta_{rf}$. Signal component $V_{IF3a}$ propagates toward terminal 19a having a composite phase shift of $2\theta_{rf} + 2\theta_{IF} = 2\pi + 0°$ and signal component $V_{IF3b}$ propagates toward terminal 19b having a composite phase shift of $2\theta_{rf} + \theta_{IF} = 3\theta$. Signal $V_{IF3b}$ combines in-phase at terminal 19b with the signals $V_{IF1b}$, $V_{IF2b}$. The fourth signal $V_{4IF}$ has a phase shift of $3\theta_{rf}$. Signal component $V_{IF4a}$ propagates towards terminal 19a having a composite phase shift of $3\theta_{rf} + 3\theta_{IF} = 2\pi + 2\theta$ and signal component $V_{IF4b}$ propagates toward terminal 19b having a composite phase shift of $3\theta_{rf}$. Signal $V_{IF4a}$ arrives at terminal 19a having a phase shift equivalent to $2\theta$ thus out-of-phase with signal component $V_{IF3a}$. Thus, a null signal is provided at terminal 19a. On the other hand, signal $V_{IF4b}$ arrives at terminal 19b having a relative phase shift of $3\theta_{IF}$ or $3\theta$ and therefore adds in-phase at terminal 19b with the signals $V_{IF3b}$, $V_{IF2b}$ and $V_{IF1b}$ previously coupled to terminal 19b. Accordingly, it is now clear that by selecting the phase shifts between input signals, and the IF output signals from adjacent pairs of transistors (i.e., FET 1, FET 2 and FET 3, FET 4) the IF signals will be out-of-phase at terminal 19a, but will be in-phase at terminal 19b.

For the case where $\omega_{LO} > \omega_{rf}$, the difference frequency signal ($\omega_{LO} - \omega_{rf}$) will provide a signal at terminal 19a having the frequency $\omega_{IF} = \omega_{LO} - \omega_{rf}$ and a null or strongly attenuated signal at terminal 19b. This can be seen by a similar analysis as described above. From each drain electrode a signal will propagate in each of two directions toward terminals 19a, 19b. However, the initial phase shifts from signals $V_{IF1}$-$V_{IF4}$ which couple from drain electrodes $D_1$-$D_4$ will have a phase lag rather than phase lead, as also shown in Table I, that is, will have a negative phase shift. Therefore, the phases of the signals coupled from each one of the drain electrodes $D_1$-$D_4$ will couple to output terminal 19a having a relative phase shift of 0° and will couple to terminal 19b having relative phase shifts of $-\theta$ or $+\theta$. Therefore, at terminal 19a will be provided the intermediate frequency signal $\omega_{IF}$ equal to ($\omega_{LO} - \omega_{rf}$) and at terminal 19b will be provided the null or strongly attenuated signal.

Preferably, however, the capacitors $C_2$-$C_5$, rather than being equal, as assumed above, are selected in accordance with the inherent capacitance (not shown) between the first gate and source of each FET to provide selected input signal amplitude tailoring to the signals fed to each first gate electrode $G_{1a}$-$G_{4a}$. The transmission lines $T_3$-$T_5$ and/or $T_7$-$T_9$ have selected impedances and electrical pathlengths, as described above to provide selected phase shift tailoring. With this arrangement, capacitors $C_2$-$C_5$ are here used to tailor the input voltage to each FET as a function of frequency. Further, the capacitors $C_2$-$C_5$ and transmission lines $T_3$-$T_5$, $T_7$-$T_9$ provide tailored electrical pathlengths to signals $V_{rf1}$-$V_{rf4}$ or $V_{IF1}$-$V_{IF2}$ in order to provide the high directivity of propagation of IF signal components $V_{1a}$-$V_{4a}$ toward terminal 19a and $V_{1b}$-$V_{4b}$ toward terminal 19b over a wide bandwidth.

Figure 2:
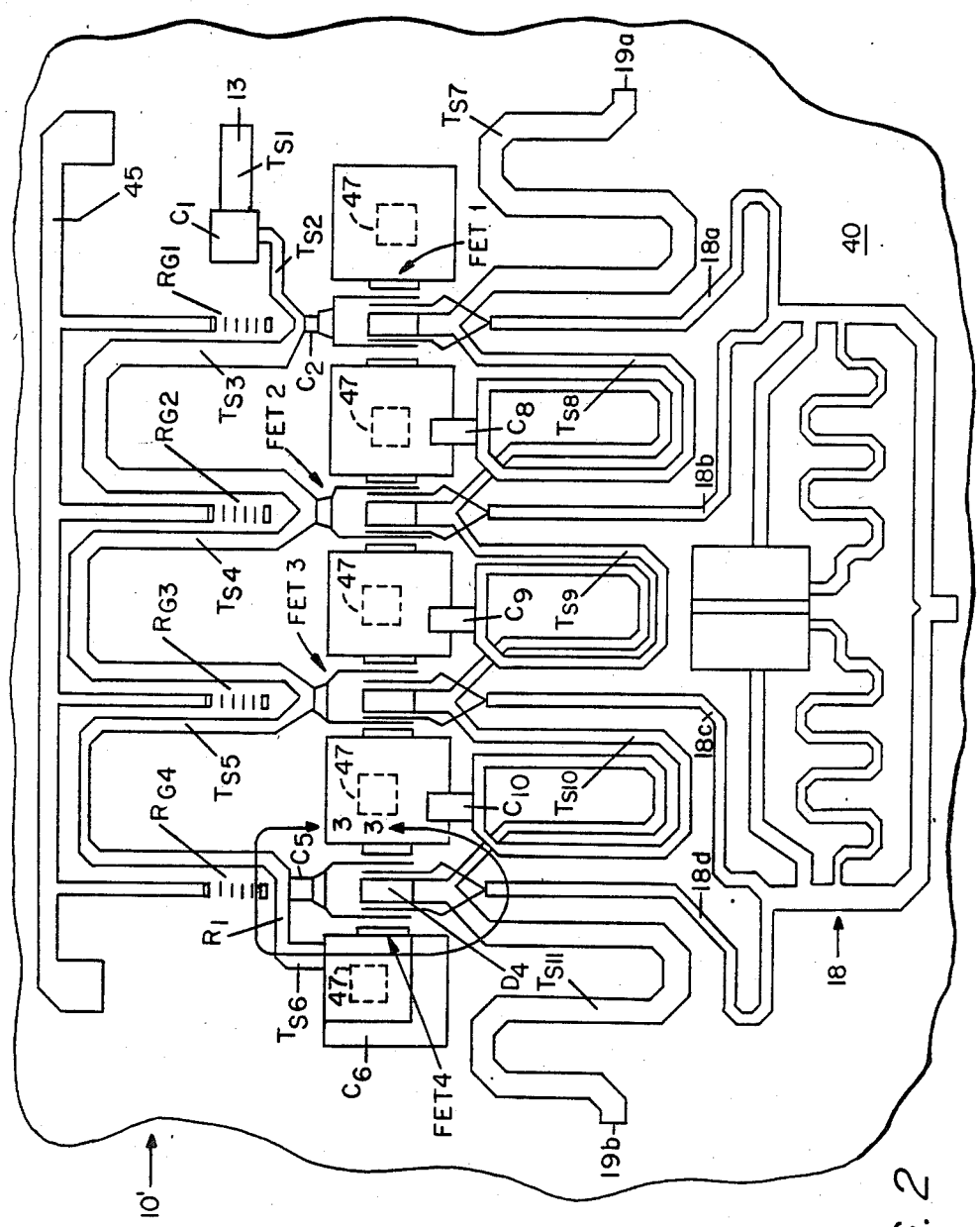
FIG. 2 is a plan view of the circuit of FIG. 1 fabricated as a microwave monolithic integrated circuit.
Figure 3:
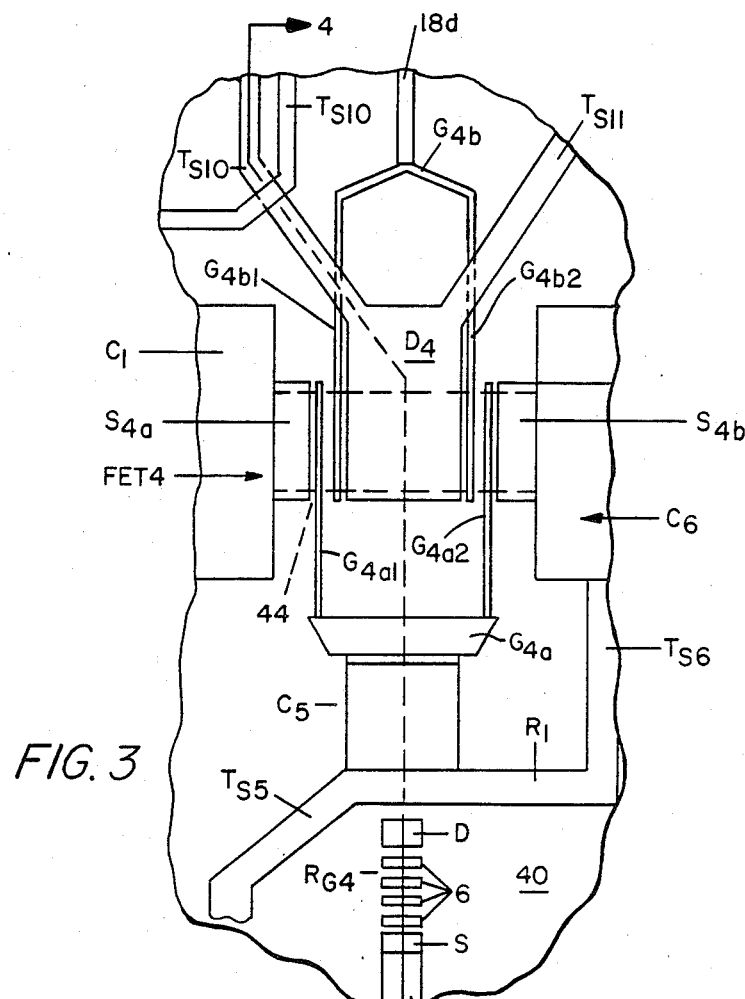
FIG. 3 is an exploded view of a portion of FIG. 2.
Figure 4:
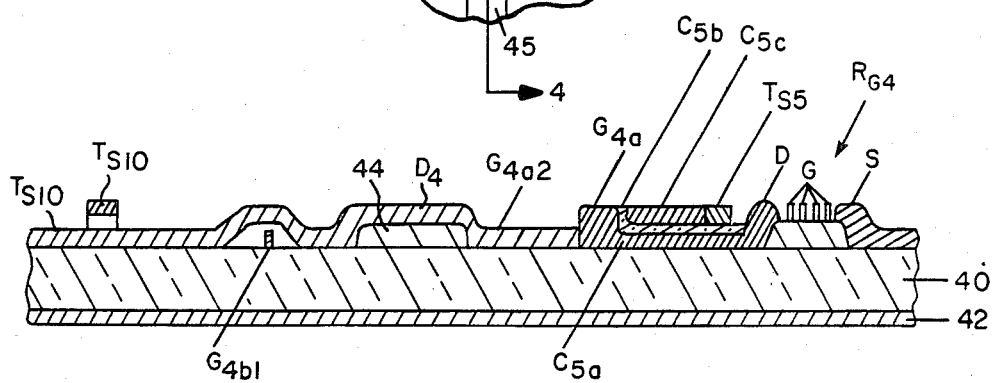
FIG. 4 is a cross-sectional view taken along line 4—4 of FIG. 3.

Referring now to FIGS. 2-4, the mixer 10 (FIG. 1) is shown fabricated as a monolithic integrated circuit 10'. The mixer 10' is formed on a substrate 40, here comprised of gallium arsenide or other suitable Group III-V material or other semiconductor material. The substrate 40 has formed on a bottom surface portion thereof, a ground plane conductor and on an upper surface portion thereof, a mesa-shaped epitaxial layer 44 (FIGS. 3, 4). The mesa-shaped layer 44 provides active regions for field effect transistors FET 1-FET 4. Here, each FET is identical in construction and includes a pair of source electrodes and a common drain electrode spaced by one gate electrode of each of a pair of gate electrodes (not numbered), as shown. Thus considering an exemplary one of such field effect transistors, here FET 4, such transistor is shown in FIGS. 3 and 4 to have a common drain pad $D_4$ connected by strip conductors $T_{s10}$, $T_{s11}$ and a pair of source contacts $S_{4a}$, $S_{4b}$ connected to ground plane conductor 42 through plated via holes 47 (FIG. 2). FET 4 is shown to further include a gate pad $G_{4a}$ having connected thereto a pair of gate fingers $G_{4a1}$, $G_{4a2}$ and a second gate pad region $G_{4b}$ having a second pair of gate fingers $G_{4b1}$, $G_{4b2}$. Source electrodes $S_{4a}$ and $S_{4b}$ are spaced from drain electrode $D_4$ by one gate finger of each pair $G_{4a1}$, $G_{4a2}$ and $G_{4b1}$, $G_{4b2}$ of gate fingers. A conductor 45 is formed on the substrate 40 to feed the gate bias signal from gate bias source (not shown) to each one of the gate electrodes. The conductor 45 is coupled to each one of the gate electrodes through resistors $R_{G1}$-$R_{G4}$, as shown. Here resistors $R_{G1}$-$R_{G4}$ are provided by open or floating gate MESFETS, as shown in FIGS. 3 and 4 for resistor $R_{G4}$. Resistors $R_{G1}$-$R_{G4}$ each provide a relatively high resistance approximately equal to 2K ohms. The drain and source electrodes D, S provide the ohmic contact terminals for resistor $R_{G4}$. Coupling capacitor $C_5$, as shown in FIGS. 3, 4, includes a first electrode $C_{5a}$ disposed on the semi-insulating substrate 40, a dielectric $C_{5b}$ disposed over the first electrode $C_{5a}$, and a second electrode contact $C_{5c}$ disposed over a portion of the dielectric $C_{5b}$. The second electrode contact $C_{5c}$ is directly connected to strip conductor $T_{s5}$ and resistor $R_1$, here a metal film resistor. The bottom contact $C_{5a}$ of capacitor $C_5$ is connected to gate electrode fingers $G_{4a1}$ and $G_{4a2}$. The bottom contact $C_{5a}$ is connected to the aforesaid mentioned gate contact $G_{4a}$ of field effect transistor FET 4. Thus, an input signal propagating along transmission lines $T_2$-$T_6$ is coupled to gate electrodes $G_{4a1}$, $G_{4a2}$ through capacitor $C_5$, whereas, the bias signal provided from resistor $R_{G1}$ is coupled directly to gate electrode fingers $G_{4a1}$, $G_{4a2}$. A similar arrangement is provided with field effect transistor FET 1. The gate electrodes $G_{2a}$, $G_{3a}$ of field effect transistors FET 2 and FET 3 are here connected directly to the transmission line sections $T_2$, $T_3$ and $T_4$.

As further shown in FIG. 2, the slrip conductors $T_{s8}$-$T_{s10}$ are arranged to provide a mutually coupled line, that is, the strip conductor is arranged in a coiled fashion having upper portions bridging over underlying portions of the strip conductors $T_{s8}$-$T_{s10}$. Capacitors $C_8$-$C_{10}$ are shunted to ground by interconnections to source pads, as shown. The width of the strip conductors, the gap between strip conductors and the length of the strip conductors are chosen for each one of said strip conductors $T_{s8}$-$T_{s10}$ to provide a predetermined electrical pathlength at the intermediate frequency signal of the mixer, as shown for example in Table 2. Here mutually coupled transmission line sections $T_8$-$T_{10}$ and capacitors $C_8$-$C_{10}$ are provided to selectively increase the electrical pathlength of each one of the transmission lines over the corresponding frequency bandwidth of the intermediate frequency signals, here 2 to 8 GHz. With this arrangement, the output coupling means comprises substantially distributed transmission line sections, whereas, the relatively large electrical pathlengths required for the distributed transmission lines between each one of the field effect transistors is provided, in part, by the mutual coupling between the lines, as well as, the capacitors $C_8$-$C_{10}$ shunted to ground.

A mixer 10, as described in FIGS. 1–4, was designed having the following characteristics: The circuit was modeled to be fabricated on a 4 mil thick GaAs substrate having disposed thereon four dual gate MESFETs, each MESFET having a 200 μm gate periphery. The mixer was designed to operate over an input signal bandwidth of 14 GHz to 20 GHz, IF bandwidth 2 Ghz to 8 Ghz at a local oscillator frequency of 12 GHz. All component values given below in Table 2 are modeled at 17 Ghz for input circuit components and 5 GHz for output circuit components. The phase shift of input transmission lines includes the phase shift provided by capacitors $C_2$ and $C_5$, and is measured with respect to the phase of the signal $V_{1rf}$ at the gate electrode $G_{1a}$.

TABLE 2

| Transmission Lines | | |
|---|---|---|
| Width of Strip Conductors | Electrical Pathlength | Capacitors Capacitance |

TABLE 2-continued

| | Input circuit | | |
|---|---|---|---|
| $T_3$ | .049 mm | $\theta_3 = 55°$ | $C_2 = 0.15$ pf |
| $T_4$ | .036 mm | $\theta_4 = 61°$ | $C_3 = \infty$ |
| $T_5$ | .026 mm | $\theta_5 = 59°$ | $C_4 = \infty$ |
| | | | $C_5 = 0.37$ pf |

| | Output circuit | | |
|---|---|---|---|
| | (W) width | (G) gap | (L) length |
| $T_7$ | .025 mm | .028 mm | 1.2 mm | $C_8 = 0.5$ pf |
| $T_8$ | .025 mm | .018 mm | 1.0 mm | $C_9 = 0.5$ pf |
| $T_9$ | .025 mm | .028 mm | 1.2 mm | $C_{10} = 0.5$ pf |

Figure 5A:
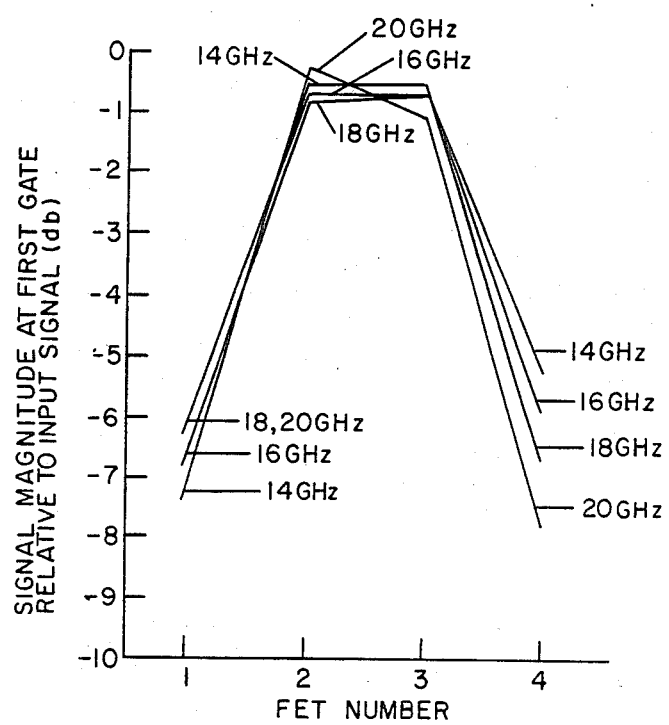
FIG. 5A is a simulated plot of input voltage signal distribution along the input coupling means.
Figure 5B:
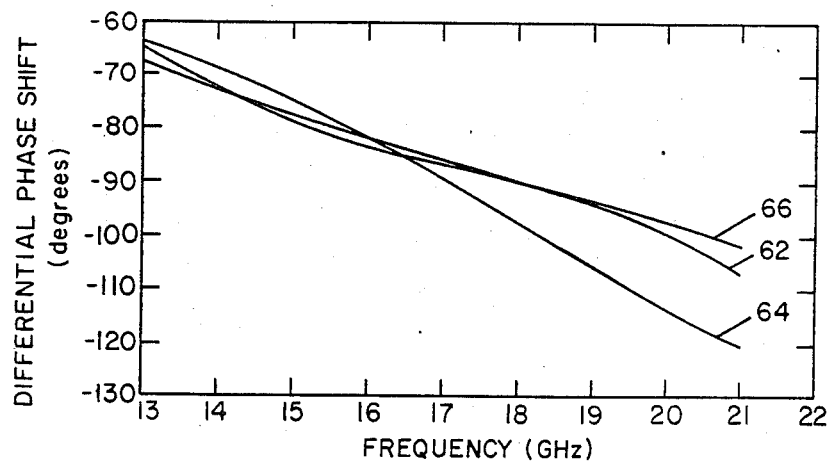
FIG. 5B is a simulated plot of the input circuit relative phase differences between succeeding adjacent pairs of non-linear devices.
Figure 6:
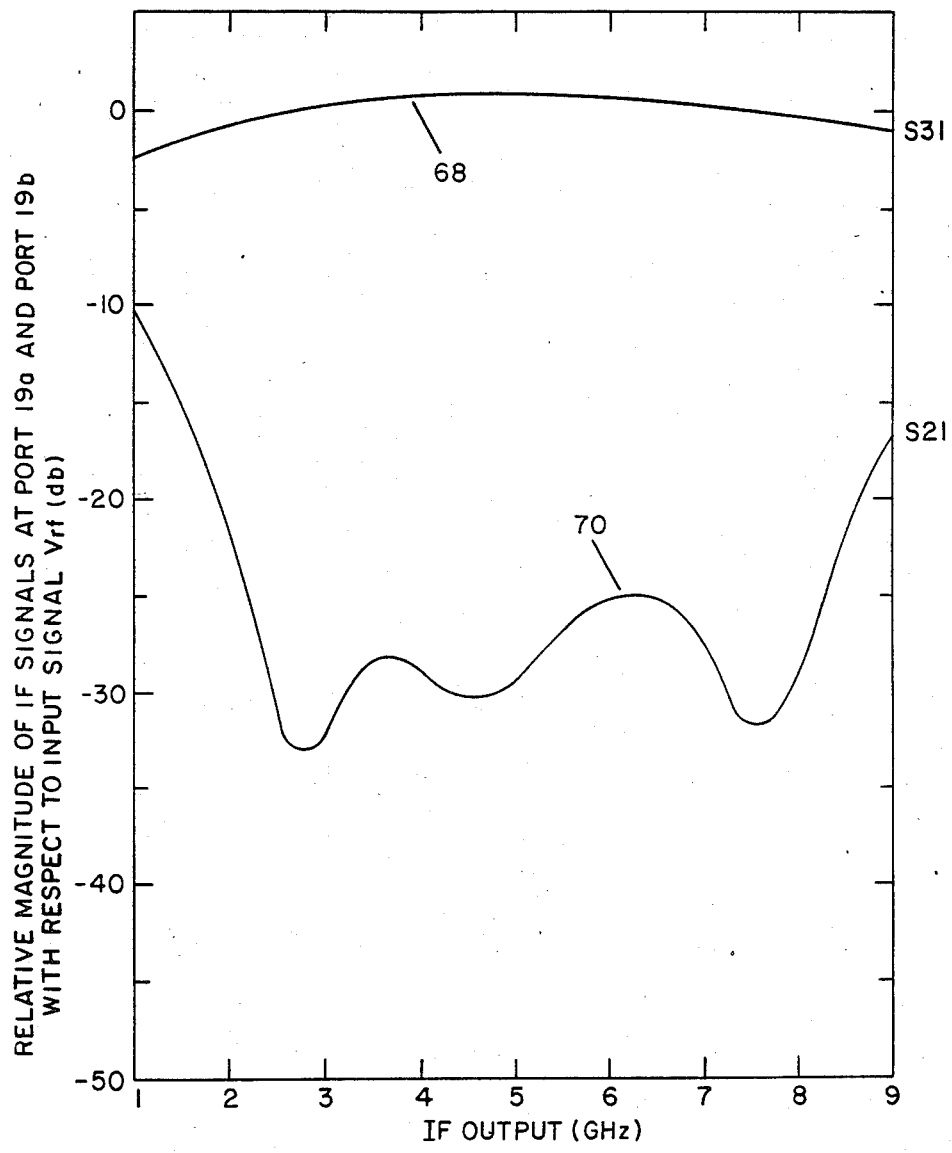
FIG. 6 is a simulated plot of the magnitude of the transfer characteristic of the circuit of FIG. 1 in accordance with the input signal profile of FIG. 5A and relative phase difference of FIG. 5B.

Referring to FIGS. 5A, 5B and 6, the input voltage profile at each FET as a function of frequency (FIG. 5A), the relative differential phase shift between succeeding adjacent pairs of input electrodes as a function of frequency (FIG. 5B), and the IF frequency output response (FIG. 6) at terminals 19a, 19b (FIG. 1) are shown, respectively, for the circuit designed in accordance with the parameters of Table 2. FIG. 5A shows the general shape of the input voltage amplitude distribution chosen to provide the relatively flat, desired output response (FIG. 6) at the IF frequency at terminal 19b and provides a null or attenuated response at terminal 19a. The attenuated input excitations to FET 1 and FET 4 are here provided by coupling capacitors $C_2$ and $C_5$, respectively. Furthermore, the varied transmission line capacitance also contributes to the general shape of the voltage distribution at each FET. Here the input coupling means 16 was optimized to provide the desired flat output response (FIG. 6) at terminal 19b (curve 68) and a null or attenuated signal at terminal 19b (curve 70) in response to r.f. input signals having a frequency greater than that of the local oscillator. However, given a desired output response at terminal 19a for input signals having a frequency less than that of the local oscillator, the input circuit could be re-optimized, as will now become apparent to those skilled in the art, by changing the values of capacitors $C_2$-$C_5$, capacitances of lines $T_2$-$T_5$ and electrical pathlengths of lines $T_2$-$T_5$. Moreover, the input coupling means may be further re-optimized to provide an output signal response at a first one of terminals 19a, 19b and a null or attenuated response at the second one of terminals 19a, 19b in accordance with the frequency of the input signal as described above.

As shown in FIG. 5B, the differential phase (expressed as a phase lag) between the first gate electrodes $G_{1a}$-$G_{4a}$ of successive adjacent pairs of FETS (FET 2 and FET 1, curve 62, FET 3 and FET 2, curve 64, FET 4 and FET 3, curve 66) was selected to be approximately 90° at the midband frequency (here 17 GHz). However, even though the phase shift changed to 70° at 14 GHz and to about 115° between FET 2 and FET 3 at 20 GHz, the output response (FIG. 6) still shows relatively good directivity of the IF signal produced by the desired input signal at the extremes (2 and 8 GHz) of the IF frequency band.

Preferably, the impedance of transmission lines $T_2$-$T_5$ is also selected in accordance with capacitors $C_2$-$C_5$, and the intrinsic capacitance (not shown) between the gate electrodes $G_{1a}$-$G_{4a}$ and source electrodes $S_1$-$S_4$ to provide the mixer 10 with a predetermined input impedance, preferably related to the impedance of transmission line $T_1$. In a similar manner, the characteristic impedance of transmission lines $T_8$-$T_{10}$ is selected in accordance with the intrinsic capacitance (not shown) between drain electrodes $D_1$–$D_4$ and source electrodes $S_1$–$S_4$, respectively, to provide the mixer 10 with a predetermined output impedance. Such an arrangement to provide selected input and output impedances is described in U.S. Pat. No. 4,456,888 issued June 26, 1984, and assigned to the same assignee as the present invention.

The field effect transistor when biased as a non-linear device generates spurious or undesirable frequency components, one of which is the second harmonic of the local oscillator signal. The mixing of the second harmonic of the LO and the input signal ($\omega_{rf}$–$\omega_{LO}$) produces a signal at the image frequency $\omega_{IM}$. This signal is particularly undesirable because the signal produced at the image band frequency increases the conversion loss of the mixer. However, with the above arrangement, because the phase of the input signal changes at each field effect transistor in accordance with the propagation of the input signal through transmission lines $T_2$–$T_5$ and the IF signals through transmission lines $T_8$–$T_{10}$, the phase of the image signal created by mixing the second harmonic of the LO and the input signal also changes as does the phase of the IF frequency when the signal produced at the image frequency is down-converted to the IF frequency. The phases of the image rf and IF signals are shown in Table 3 below. The direction of the phase progression indicates that the signal produced at the image frequency will propagate back in the direction of the signal source. Along this propagation, some of this signal is fed back to FET 1–FET 4 and down-converted to the IF image frequency. The resulting IF image signal will propagate in the same direction as the desired IF signal provided in response to the input signal, and therefore, the signal produced at the image frequency will be provided at the same terminal as the desired IF signal. This will reduce conversion loss of the mixer circuit.

TABLE 3

| FET | $\omega_{rf} > \omega_{LO}$ rf | phase shift | Image signal freq. | phase shift | IF from Image freq. | phase shift |
|---|---|---|---|---|---|---|
| 1 | $\omega_{LO} + \omega_{IF}$ | 0 | $\omega_{LO} - \omega_{IF}$ | 0 | $\omega_{IF}$ | 0 |
| 2 | $\omega_{LO} + \omega_{IF}$ | $\theta$ | $\omega_{LO} - \omega_{IF}$ | $\theta$ | $\omega_{IF}$ | $\theta$ |
| 3 | $\omega_{LO} + \omega_{IF}$ | $2\theta$ | $\omega_{LO} - \omega_{IF}$ | $2\theta$ | $\omega_{IF}$ | $2\theta$ |
| 4 | $\omega_{LO} + \omega_{IF}$ | $3\theta$ | $\omega_{LO} - \omega_{IF}$ | $3\theta$ | $\omega_{IF}$ | $3\theta$ |

The mixer circuit 10 (FIG. 1) also provides substantially complete cancellation of noise introduced into the IF band by the local oscillator signal. As seen in FIG. 7, noise associated with the local oscillator frequency signal is in general clustered in a relatively narrow band about the local oscillator frequency $f_{LO}$. However, while this condition is not a prerequisite for noise cancellation to occur in the circuit described in FIG. 1, assumption of this condition makes the following analysis easier.

For noise cancellation to occur in the circuit of FIG. 1, it is generally required that the local oscillator frequency excitation of each field effect transistors FET 1–FET 4 be in-phase and of equal amplitude. Each frequency component of the noise, therefore, will mix with the local oscillator carrier frequency and be down-converted to the IF band. This includes noise in both the upper and lower side bands of the local oscillator signal. The phase difference between the noise components of the IF ports, IF$_1$ and IF$_2$, will be substantially equal to zero since the local oscillator excitation of each field effect transistor FET 1–FET 4 arises from input signals provided from the same signal source having substantially equal phase and amplitude.

Figure 8:
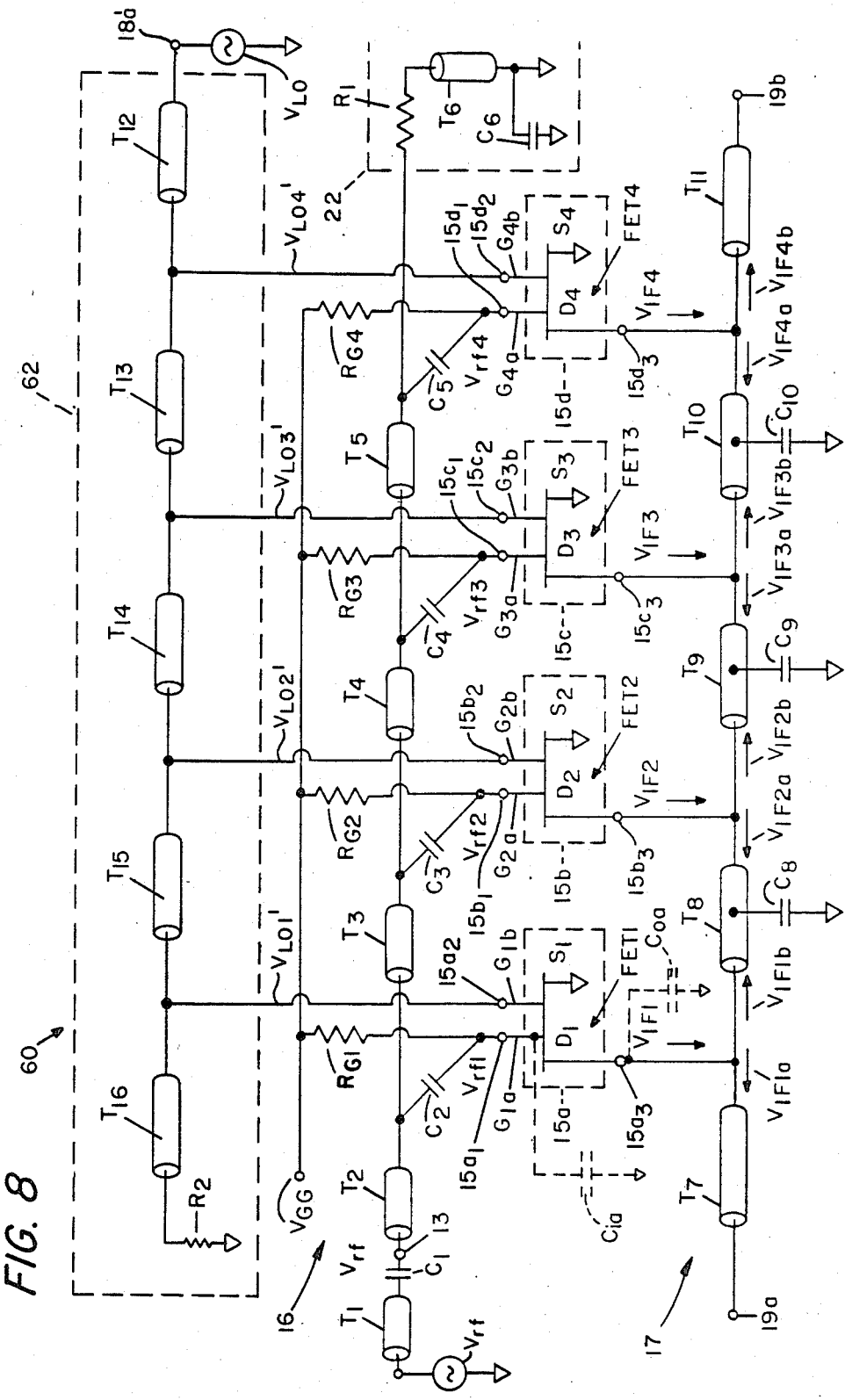
FIG. 8 is a schematic diagram of an alternate embodiment of a frequency conversion circuit, here a mixer circuit.

Assuming that the IF noise voltage component at, the nth IF port is denoted by $e_n$ ($f_m$) where $f_m$ is the frequency offset of the noise component from the carrier such as shown in FIG. 8, and, n is the number of IF ports (not necessarily equal to four), then because all $e_n$ signals are from the same local oscillator frequency source, these components are fully correlated and can be added algebraically. Taking the phase shift introduced between the IF ports by the IF circuit into consideration, the noise voltage corresponding to the frequency component $f_m$ at the two IF ports labeled 19a and 19b in FIG. 1 is given by:

$$e_{19a}(f_m) = \sum_{n=1} e_n(f_m)e^{-j(n-1)\theta}$$

$$e_{19b}(f_m) = \sum_{n=1} e_n(f_m)e^{-j(N-n)\theta}$$

For balanced mixers, $e_n = e_k$ for all n and k. Thus, $$e_{19a}(f_m) = e_{19b}(f_m) = e(f_m)e^{(-j(N-1)\theta)/2} \frac{\sin(N\theta/2)}{\sin(\theta/2)}$$

Therefore, for all other frequency components about the local oscillator carrier frequency, the above relationship is true. It is evident that complete noise cancellation of the frequency noise occurs when $\theta$ is chosen to satisfy the condition $\theta = 2\pi/N$ for (N > 1).

For example, for four field effect transistors, as shown in FIG. 1, N = 4, the required phase shift between field effect transistor and IF terminals is 90°. This simple case may be shown by a vector diagram (not shown) of the noise voltage components at each IF port. Because of the 90° phase shift, the components are added vectorially as the four-sides of a square to a null vector.

Referring now to FIG. 8, an alternate embodiment of a frequency conversion circuit, here a mixer circuit 60 is shown. Mixer circuit 60 includes the aforementioned output coupling means 17, input coupling means 16, and a plurality of non-linear elements 15a–15d, here each including the field effect transistors FET 1–FET 4 as described in conjunction with FIG. 1. Mixer circuit 60 is shown to further include a second input traveling wave structure 62, here comprising a plurality of distributed transmission lines $T_{12}$–$T_{16}$, here each one of said transmission lines being a microstrip transmission line. A first end of transmission line T1hd 16 is terminated in a characteristic impedance, here shown as $R_2$, and a first end of said distributed transmission line $T_{12}$ is coupled to a local oscillator signal $V_{LO}$. Accordingly, local oscillator signal $V_{LO}$ propagates along transmission line sections $T_{12}$–$T_{16}$, with portions of said signals $V_{LO'1}$–$V_{LO'4}$ being fed from said transmission lines to each one of the corresponding gate electrodes $G_{1b}$–$G_{4b}$. The local oscillator signal is fed to terminal 18a' and propagates along transmission lines $T_{14}$–$T_{16}$ having progressively or successively increasing phase shifts. As before, the input signal $V_{rf}$ propagates along transmission lines $T_2$–$T_5$ and is coupled to corresponding gate electrodes $G_{1a}$–$G_{4a}$. Since the local oscillator $V_{LO}$ and the input signal $V_{rf}$ propagate in opposite directions, the relative phase shift difference between the pair of signals will be the sum of the respective phase shifts at the input electrodes of each one of the field effect transistors. Accordingly, the pathlength of the traveling wave structure 62 for the local oscillator signal may be adjusted to provide additional control of the phase shift of the signals coupled to the output or drain electrodes of each one of the field effect transistors. Accordingly, the phase shift of the IF signal at the output of each one of the field effect transistors becomes the sum of the phase shift from the r.f. input signal line, and the phase shift from the local oscillator signal line. Preferably, as shown in FIG. 7, coupling capacitors $C_2$-$C_5$ are used to provide amplitude tailoring to the input signals as described in conjunction with FIG. 1. Further, by providing a traveling wave structure 62 to feed the local oscillator signal to each FET, the local oscillator signal may be swept or varied over a broad range of frequencies.

Referring now to FIGS. 9-11, alternate embodiments for the mixer elements 15a-15d (FIG. 1) are shown. As an illustrative example, element 15a is shown in FIG. 9 having dual-gate field effect transistor FET 1 (FIG. 1) replaced by a diode $D_1$ and a capacitor C coupled in shunt between a cathode of diode $D_1$ and ground. The local oscillator signal $V_{LO}$ and the radio frequency input signal ($V_{rf}$) are fed via terminal $15a_1$ to an anode of diode $D_1$ with the cathode providing the output signal $V_{IF1}$ at terminal $15a_3$. Similarly, as shown in FIG. 10, the dual-gate field effect transistor FET 1 (FIG. 1) may be replaced by a single gate field effect transistor, here FET 1', having a first one of drain and source electrodes D', S' being fed via terminal $15a_1$ by an RF signal ($V_{rf}$) and the gate electrode, for example, being fed via terminal $15a_2$ by the local oscillator signal ($V_{LO}$) with the second one of the drain and source electrodes providing the output signal $V_{IF1}$ at terminal $15a_3$. Similarly, as shown in FIG. 11, dual-gate field effect transistor FET 1 (FIG. 1) may be replaced by a pair of field effect transistors FET 2', FET 3'. The first field effect transistor FET 2' connected in a common source configuration has a gate electrode $G_2'$ fed, via terminal $15a_1$, the r.f. input signal $V_{rf}$ and provides an output signal to a first one of drain and source electrodes $D_3'$, $S_3'$ of the field effect transistor FET 3'. The field effect transistor FET 3' is fed, via terminal $15a_2$, the local oscillator signal ($V_{LO}$) which modulates the transconductance of field effect transistor FET 3' to produce the mixed output signal $V_{IF1}$ at terminal $15a_3$. It can be seen, therefore, by substituting the dual-gate field effect transistors FET 1-FET 4 of FIG. 1 with any one of the above devices between the input coupling means 16 and output coupling means 17, alternate embodiments of the frequency conversion circuit may be provided.

Figures 12, 13:
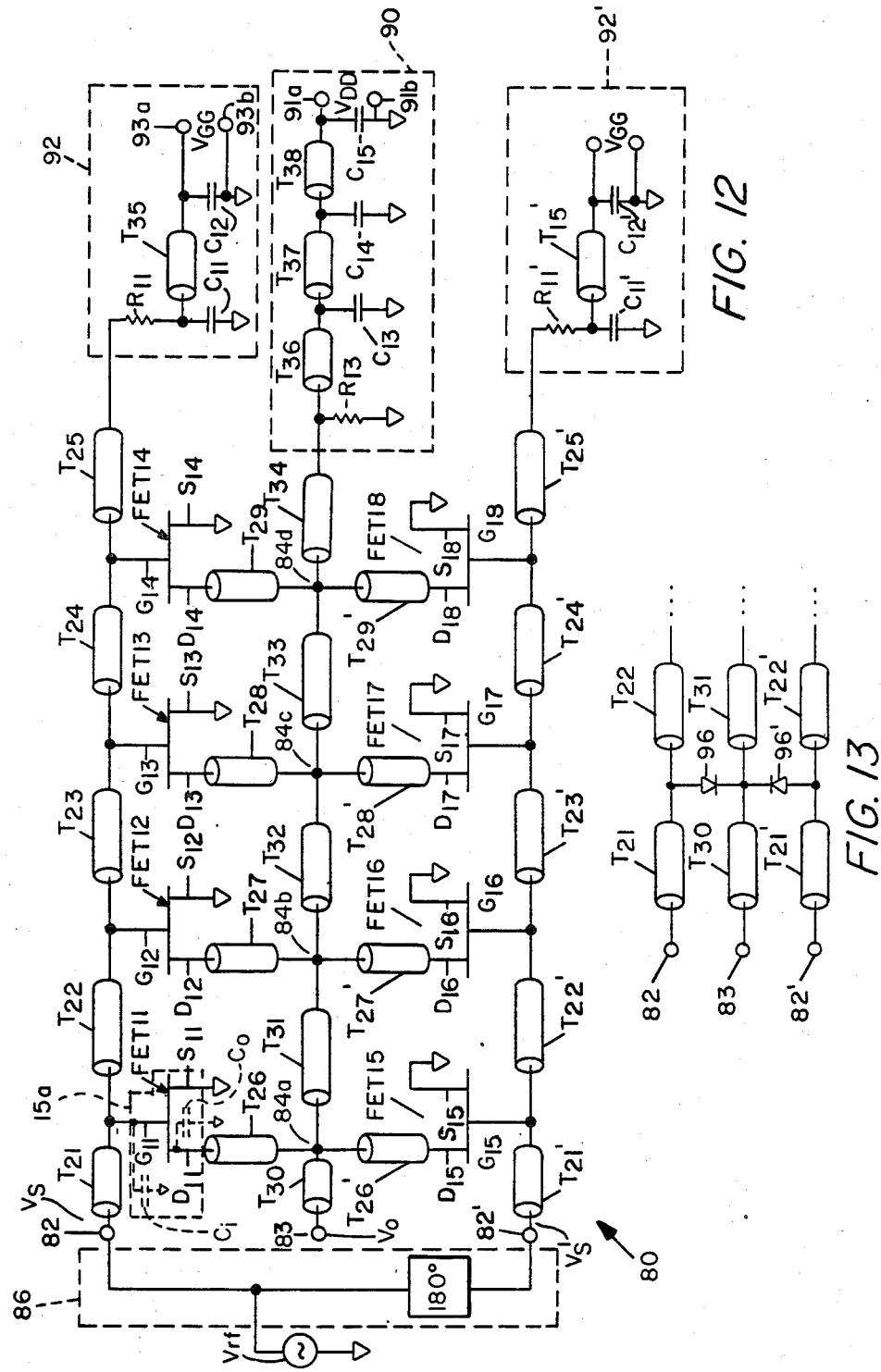
FIG. 12 is a schematic diagram of a further alternate embodiment of a frequency conversion circuit, here a frequency multiplier.
FIG. 13 is a schematic diagram of an alternate embodiment of a non-linear device for use in the invention as shown in FIG. 12.

Referring now to FIG. 12, a further alternate embodiment of a frequency conversion circuit, here a distributed frequency multiplier 80 is shown to include a first plurality or set of here four field effect transistors FET 11-FET 14 successively coupled between an input terminal 82 and an output terminal 83, via a plurality of two port phase shift elements such as an artificial line or a distributed line. Here again non-linear elements are provided with element 15a only shown for clarity. Here the two port elements comprise a plurality of distributed input transmission lines $T_{21}$-$T_{25}$ and a plurality of output transmission lines $T_{26}$-$T_{29}$ and $T_{30}$-$T_{34}$. Here transmission lines $T_{21}$-$T_{34}$ are microstrip transmission lines. The field effect transistors FET 11 to FET 14 have input electrodes, here gate electrodes $G_{11}$ to $G_{14}$, respectively, successively electrically interconnected via the first plurality of transmission lines $T_{21}$-$T_{25}$. The output electrodes, here drain electrodes $D_{11}$-$D_{14}$ are successively electrically interconnected via transmission lines $T_{26}$-$T_{29}$ and common output lines $T_{30}$-$T_{34}$. Source electrodes $S_{11}$ to $S_{14}$ of transistors FET 11 to FET 14, respectively, are connected to a reference potential, here ground, through a common RF and DC path, as shown. The gate electrode of the first one of the field effect transistors, here gate electrode $G_{11}$ of FET 11 is coupled to input terminal 82 through transmission line $T_{21}$, whereas the drain electrode $D_{11}$ of the first field effect transistor FET 11 is coupled to an RF output terminal 83 through transmission lines $T_{26}$ and $T_{30}$. A succeeding one of the field effect transistors, here the last or fourth field effect transistor FET 14 has an input or gate electrode $G_{14}$ coupled to a gate DC bias circuit 92 through transmission line $T_{25}$, as shown, and has the output or drain electrode $D_4$ of such field effect transistor FET 4 coupled via transmission lines $T_{29}$ and $T_{34}$ to the output or drain bias circuit 90, as shown.

The distributed frequency multiplier circuit 80 is shown to further include a second plurality of here four field effect transistors FET 15-FET 18 successively coupled between an input terminal 82' and the output terminal 83 via a second plurality of two port phase shift elements such as an artificial line or a distributed line. Here again non-linear elements are provided as shown in FIGS. 1, 8 and as shown for FET 11, as described above. Here the two port elements comprise a plurality of distributed input transmission lines $T_{21}'$ to $T_{25}'$, and a second plurality of two port elements or drain transmission lines $T_{26}'$ to $T_{29}'$ and the common output drain transmission lines $T_{30}$ to $T_{34}$. The field effect transistors FET 15-FET 18 have input electrodes, here gate electrodes $G_{15}$-$G_{18}$, respectively, successively electrically interconnected via the second plurality of transmission lines $T_{21}'$ to $T_{25}'$, here each line being a microstrip transmission line. The output electrodes, here drain electrodes $D_{15}$-$D_{18}$ of field effect transistors FET 15-FET 18, respectively, are successively electrically interconnected via the drain electrode transmission lines $T_{26}'$ to $T_{29}'$ and the common transmission lines $T_{30}'$, $T_{34}'$. The source electrodes $S_{15}$-$S_{18}$ of transistors FET 15-FET 18, respectively, are connected to a reference potential, here ground, through a common DC and RF path, as shown. The gate electrode of the first one of the second set of field effect transistors, here gate electrode $G_{15}$ of FET 15 is coupled to the input terminal 82', via transmission line $T_{21}'$, whereas the drain electrode $D_{15}$ of the first field effect transistor FET 15 of the second set of field effect transistors is coupled to the output terminal 83 via transmission line $T_{26}'$ and $T_{30}$. A succeeding one of the field effect transistors, here the last or fourth field effect transistor, here FET 18 of the second set of field effect transistors has an input or gate electrode $G_{18}$ coupled to a gate DC bias circuit 92' via transmission line $T_{25}'$, as shown, and the output or the drain electrode $D_{18}$ of such field effect transistor FET 18 is coupled to the output or drain bias circuit 90 via transmission lines $T_{29}'$ and $T_{34}$, as shown.

The drain bias circuit 90 is here a ladder network having three shunt paths to ground via capacitors $C_{13}$, $C_{14}$, $C_{15}$ with transmission lines, here microstrip transmission lines $T_{36}$, $T_{37}$ and $T_{38}$ providing serial elements of such network. A pair of bias terminals 91a, 91b are adapted for coupling to a grounded DC bias source $V_{DD}$, such terminal 21a being connected to capacitor $C_{15}$ and transmission line section $T_{38}$, as shown. Capacitors $C_{13}$, $C_{14}$ and $C_{15}$ provide a relatively low impedance path to radio frequency (RF) signals and thus shunt such radio frequency signals to ground to prevent such RF signals from being coupled to the DC bias source $V_{DD}$. A resistor $R_{12}$ is shown coupled in shunt with ground and the connection between transmission line $T_{36}$ and transmission line section $T_{34}$. Resistor $R_2$ in combination with the composite impedance of transmission line sections $T_{36}$, $T_{37}$ and $T_{38}$ and capacitors $C_{13}$, $C_{14}$ and $C_{15}$ provide a complex impedance for matched termination of transmission line section $T_{34}$.

Gate bias circuits 92 and 92' are substantially identical and therefore the description of gate bias circuit 92 is likewise applicable to gate bias circuit 92'. The gate bias circuit 92 is also a ladder network and includes a serially connected resistor $R_{11}$ and transmission line section $T_{35}$. Transmission line section $T_{35}$ and resistor $R_{11}$ provide a direct current path between input bias terminal 26 and the microwave transmission lines $T_{21}$–$T_{25}$. Radio frequency bypass capacitors $C_{11}$ and $C_{12}$ are coupled in shunt between the ends of transmission line section $T_{35}$ and ground. Again, such radio frequency bypass capacitors $C_{11}$, $C_{12}$ provide low impedance paths to radio frequency signals shunting such radio frequency signals to ground and thereby isolate such radio frequency signals from a voltage source $V_{GG}$ which is coupled between ground terminal 23b and terminal 23a.

The characteristics of drain and gate bias circuits are selected to place each of the field effect transistors in the non-linear or square law region of their respective transfer characteristics.

A signal is fed from a source $V_{rf}$ to a directional coupler 86 which provides at its output terminals (not numbered) a pair of input signals $V_S$, $V_S'$ having a 180° differential phase shift. Alternatively, the input signal $V_{rf}$ may be fed to a common junction including a pair of transmission lines having a differential pathlength corresponding to a phase shift of 180°. Thus, the first signal $V_S$ is coupled to input terminal 82 and propagates along transmission lines $T_{21}$ to $T_{25}$. A portion of signal $V_S$ is coupled to each one of the gate electrodes $G_{11}$ to $G_{14}$ of FET 11–FET 14. At the output of the corresponding drain electrodes $D_{11}$ to $D_{14}$, an output signal appears having frequency components equal to $\omega_o$, $2\omega_o$, $3\omega_o$, . . . $n\omega_o$ where n is an integer greater than 1 and $\omega_o$ is the fundamental frequency of the radio frequency input source $V_{rf}$, and where $2\omega_o$, $3\omega_o$, . . . $n\omega_o$ are the even and odd harmonics of the fundamental frequency $\omega_o$. Similarly, the second signal $V_S'$ is fed to the input terminal 82' and such signal propagates along transmission lines $T_{21}'$ to $T_{25}'$ and a portion of such signal is coupled to gate electrodes $G_{15}$ to $G_{18}$. In response, an output signal is produced at each of the drain electrodes $D_{15}$ to $D_{18}$, having frequency components $\omega_o$, $2\omega_o$, $3\omega_o$, . . . $n\omega_o$, again where n is equal to an integer greater than 1 and $\omega_o$ is the fundamental frequency of the radio frequency source $V_{rf}$. Signals from drain electrodes $D_{11}$ to $D_{14}$ and $D_{15}$ to $D_{18}$ are coupled to radio frequency transmission lines $T_{30}$–$T_{34}$ at corresponding junctions 86a–86d. The same electrical pathlengths are provided between each one of said input terminals 82, 82' and output terminal 83 through respective ones of each of said pairs of field effect transistors (i.e., FET 11, FET 15; FET 12, FET 16; FET 13, FET 17; and FET 14, FET 18). Since the input signals $V_S$, $V_S'$ are fed to terminals 82 and 82' having a 180° differential phase shift, signals coupled from respective pairs of drain electrodes $D_{11}$ and $D_{15}$, $D_{12}$ and $D_{16}$, $D_{13}$ and $D_{17}$, $D_{14}$ and $D_{18}$ will have the fundamental frequency components having the 180° differential phase shift, and the odd harmonics of the fundamental will likewise have a 180° differential phase shift. Therefore, the initial phase relationship of 180° provided by the coupler 30 is maintained in each frequency component of the signal having an odd multiple harmonic relationship with the fundamental. With this arrangement, all the odd harmonics $(2n+1)\omega_o$ of the fundamental frequency component of the signal including the fundamental component coupled from the output terminal 83 will cancel at terminal 83. On the other hand, since the devices are half-wave vth, more preferably, square law, non-linear devices, all the even harmonics $(2n)\omega_o$ will have a phase difference corresponding to multiples of 0° and therefore all of the even harmonics will be summed in-phase and will appear at the output terminal 83, as a composite signal $V_O$.

At the output terminal 83 the composite signal is provided having even harmonic frequency components. A selected frequency component may be recovered from such signal in one of several ways. One approach is to provide the output coupling lines $T_{26}$–$T_{29}$, $T_{26}'$–$T_{29}'$ and $T_{30}$–$T_{34}$ with a bandpass filter characteristic permitting only the selected even harmonic to propagate therethrough. An alternative way is to provide a lumped filter arrangement at the output of the radio frequency terminal 83 to pass the desired even harmonic.

Preferably, in order to provide relatively broadband performance, that is, operation over a relatively broad range of input signal frequencies, the characteristic impedance of each one of the transmission lines $T_{21}$–$T_{25}$, $T_{21}'$–$T_{25}'$ is selected in accordance with the inherent input reactance between gate and source of the field effect transistors FET 11–FET 14 and FET 15–FET 18 to provide an input network having a predetermined characteristic impedance. In a similar manner, the characteristic impedance of the output transmission lines $T_{26}$–$T_{29}$, $T_{26}'$–$T_{29}'$ and $T_{30}$–$T_{34}$ are selected in accordance with the inherent output reactance between drain and source of such field effect transistors FET 11–FET 14 and FET 15–FET 18 to provide an output network having a predetermined output impedance. Such an arrangement is described in the U.S. Pat. No. 4,456,888 issued June 26, 1984, and assigned to the same assignee as the present invention.

Referring now to FIG. 13, an alternate embodiment for a non-linear device, here a diode such as Schottky diodes 96, 96', are shown. The Schottky diode would be used to replace the field effect transistors (FET 11, FET 15) as illustratively shown in FIG. 13. The diode being a non-linear device would provide similar signal cancellation by proper phasing of the odd harmonics of the output signals and signal enhancement of the even harmonics, as described above.

Figure 14:
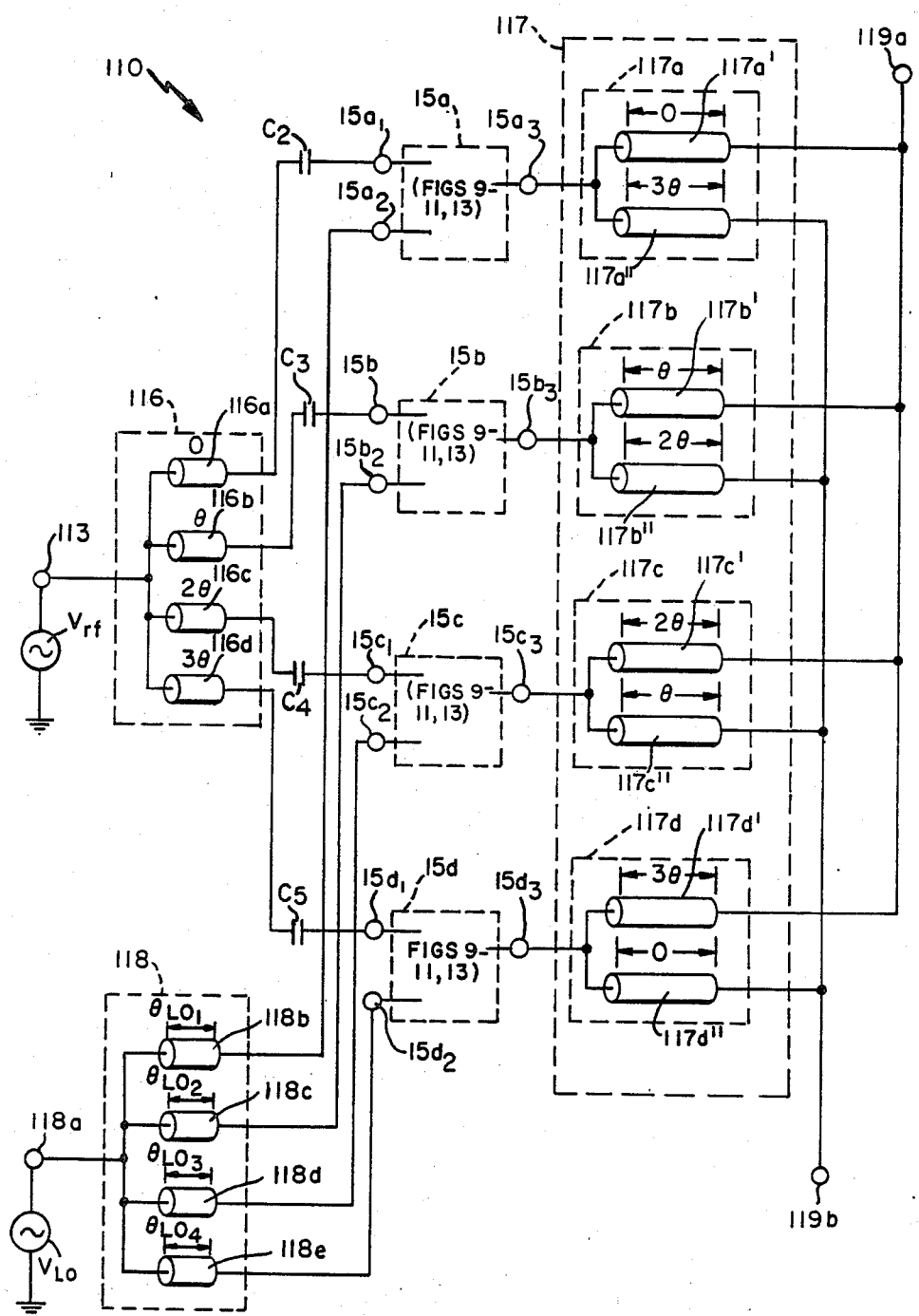
FIG. 14 is a schematic diagram of a further alternate embodiment of a frequency conversion circuit.

Referring now to FIG. 14, a further alternate embodiment of a frequency conversion circuit, here a mixer 110, is shown to include the first plurality of here four non-linear elements 15a–15d, here each one of said elements including one of the active elements described in conjunction with FIGS. 9–11 or the dual-gate field effect transistor shown in FIG. 15. Here said non-linear elements are, for example, half wave vth law devices, such as a half wave square law device. Each one of said non-linear elements 15a–15d is coupled to a corresponding one of a plurality of output phase shifting elements 117a–117d. Each one of said phase shifting elements 117a–117d includes respective pairs of any generalized two port elements 117a'–117d' and 117a"–117d", here each one of said two port phase shifting elements may include an artificial line or a distributed transmission line. Alternatively, the pairs of two port elements may be active devices such as an amplifier or other non-reciprocal two port elements. Here one of said two port distributed lines has a common connection which is coupled to respective output ports $15a_3$–$15d_3$ of respective ones of the non-linear elements 15a–15d and has a pair of input ports connected to one of a pair of output terminals 19a, 19b of the circuit. The circuit 110 is shown to further include an input coupling means 116, here comprising a plurality of transmission lines 116a–116d, each one of said lines having a predetermined electrical pathlength, to provide a differential pathlength or phase shift between adjacent successive pairs of said lines 116a–116d. An input signal $V_{rf}$ is fed to an input terminal 113 of the circuit and said signal is distributed to each one of said transmission lines 116a–116d from a common connection with terminal 113. The outputs of said transmission lines 116a–116d are fed preferably through one of a corresponding plurality of capacitors $C_{12}$–$C_{15}$ with the output of said capacitors feeding input terminals $15a_1$–$15d_1$ of the respective non-linear elements 15a–15d. A second input signal, here a local oscillator signal, is coupled to a second input terminal 118a, and said signal is fed to a local oscillator coupling means 118. Local oscillator coupling means 118 here comprises a plurality of here four, two port phase shifting elements 118b–118e, here said elements comprising a distributed transmission line. The phase shifts $\theta_{LO1}$–$\theta_{LO4}$ provided by said distributed transmission lines 118b–118e in a first embodiment of the local oscillator means 118 have substantially equal pathlengths and in a second embodiment of the means, the electrical pathlengths $\theta_{LO1}$–$\theta_{LO4}$ have successively increasing electrical pathlengths. The outputs of said local oscillator coupling means feed a portion of the local oscillator signal to corresponding ones of said second input terminals $15a_2$–$15d_2$ of respective non-linear elements 15a–15d.

In operation, input signals fed to terminals 113 and 118 are coupled via the input coupling means 116 and local oscillator coupling means 118 to respective input terminals $15a_1$–$15d_1$ and $15a_2$–$15d_2$ of the non-linear elements 15a–15d and produce at the outputs of said elements $15a_3$–$15d_3$ signals having frequency components equal to the sum and difference of the input signals, as well as, harmonics of the input signals. The signals propagate through one of the pair of two port phase shifting elements of each one of the output coupling means to provide at a first one of the output terminals 119a, 119b, an output signal having one of the aforementioned frequency components and at the second one of the output terminals 119a, 119b, a null or attenuated output signal in accordance with the relative frequency of the pair of input signals. Radio frequency circuit 110 is a non-distributed, non-successive interconnected version of the radio frequency conversion circuit shown in conjunction with FIGS. 1, 7 and 12. By adjusting the electrical pathlengths of the two port phase shifting elements comprising the output coupling means 117, input coupling means 116, and local oscillator coupling means 118, any one of the aforementioned radio frequency conversion circuits, the mixer 10 (FIG. 1), the mixer 60 (FIG. 8) and the multiplier 80 (FIG. 12) may be fabricated in a non-distributed version using two port phase shifting elements.

Having described preferred embodiments of this invention, it will now be apparent to one of skill in the art that other embodiments incorporating its concept may be used. It is felt, therefore, that this invention should not be restricted to the disclosed embodiment, but rather should be limited only by the spirit and scope of the appended claims.

What is claimed is:

1. A radio frequency circuit having at least one output terminal comprising:
   (a) a plurality of non-linear elements, each having an output electrode;
   (b) means for feeding a pair of input signals each having a predetermined frequency to each one of said non-linear elements, said means further comprising:
      (i) means, including at least one two port phase shifting element fed by at least one of the pair of input signals, for providing a plurality of signals portions, each one fed to a corresponding one of said plurality of non-linear elements, said signal portions having a successively increasing phase shift related to the electrical phase shift provided by the two port phase shifting element;
   (c) interconnecting means, including at least one, different, two port phase shifting element, for successively electrically interconnecting the output electrode of each non-linear element; and
   wherein in response to said pair of input signals, output signals are provided from each non-linear element to the output terminal having frequency components related to the sum of and difference between the frequencies of the pair of input signals to provide a composite output signal having frequency components related to the sum of and difference between the frequencies of the pair of input signals.

2. The circuit of claim 1 wherein the two port phase shifting element of the means for providing a plurality of said signal portions is a radio frequency transmission line.

3. The circuit of claim 2 wherein the radio frequency transmission line is a lumped element artificial line.

4. The circuit of claim 2 wherein the radio frequency transmission line is a distributed transmission line.

5. The circuit of claim 4 wherein the circuit provide at the output terminal the composite signal having a frequency component equal to a first one of the sum and the difference frequency components and wherein a second one of the sum and difference frequency components is substantially removed from the composite signal in accordance with a frequency bandwidth characteristic of the output means.

6. A radio frequency conversion circuit having a pair of output terminals, and a pair of input terminals each input terminal being fed by one of a pair of input signals each input signal having a predetermined radio frequency, comprising:
   (a) a plurlity of non-linear elements each having at least one input electrode, and an output electrode;
   (b) means for feeding the pair of input signals, comprising:
      (i) a first plurality of two port phase shifting elements each one having a first end connected together at a first common junction fed by a first one of the pair of input signals, and each one having a second end connected to one of said plurality of non-linear elements, said phase shifting elements providing a successively increasing phase shift to an input signal portion fed to a first non-linear element and to a succeeding input signal portion fed to a succeeding non-linear element;

(ii) means for feeding the second one of the input signals to the non-linear elements;

(c) interconnecting means, including a second plurality of two port phase shifting elements, for electrically interconnecting the output electrode of each non-linear element, a first portion of said second plurality of being connected between the output electrode of each non-linear element and a first output terminal, and a second remaining portion of said second plurality being connected between the output electrodes of each non-linear element and a second output terminal; and wherein in response to said first and second signals, an output signal is provided from each one of the non-linear elements having frequency components related to the sum of and difference between the frequencies of said input signals, and in response to said output signals, a composite output signal is provided at one of said output terminals having at least one frequency component related to the sum of and difference between the frequencies of the pair of input signals.

7. The circuit of claim 6 wherein the phase shifts provided by the first plurality non-linear elements and the second plurality of non-linear element are each selected to provide said composite signal at one of said terminals in accordance with the relative frequency difference between the pair of input signals.

8. The circuit of claim 7 further comprising means including said first and second plurality of phase shift elements for selectively tailoring as a function of frequency the phase and amplitude characteristic of said output signals from the non-linear elements.

9. The circuit as recited in claim 8 wherein said tailoring means includes capacitors coupled between the first plurality of two port phasing elements and input electrodes of the non-linear elements.

* * * * *

UNITED STATES PATENT AND TRADEMARK OFFICE
CERTIFICATE OF CORRECTION

PATENT NO. : 4,709,410
DATED : Nov. 24, 1987
INVENTOR(S) : Yusuke Tajima, Robert A. Pucel It is certified that error appears in the above-identified patent and that said Letters Patent is hereby corrected as shown below:

Column 4, line 21, delete "$V_{rf2}-V_{rf4}$" and replace with --$V_{rf1}-V_{rf4}$--.

Column 5, line 50, delete "$V_{If4b}$" and replace with --$V_{IF4b}$--.

Column 6, line 34, delete "$T_3-T_5,$" and replace with --$T_3-T_5$--.

Column 6, line 37, delete "$V_{1a}-V_{4a}$" and replace with --$V_{1a}-V_{4a}$--.

Column 7, line 26, delete "slrip" and replace with --strip--.

Column 7, line 39, delete "$C_8-C_{10}$" and replace with --$C_8-C_{10}$--.

Column 8, line 63, delete "$C_2-C_5$" and replace with --$C_2-C_5$--.

Column 9, line 13, delete "$(\omega_{rf}-\omega_{LO})$" and replace with --$(\omega_{rf}-2\omega_{LO})$--.

Column 10, line 55, delete "Tlhd 16" and replace with --$T_{16}$--.

Column 16, line 47, delete "provide" and replace with --provides--.

Column 16, line 60, delete "plurlity" and replace with --plurality--.

UNITED STATES PATENT AND TRADEMARK OFFICE
CERTIFICATE OF CORRECTION

PATENT NO. : 4,709,410
DATED : November 24, 1987
INVENTOR(S) : Yusuke Tajima, Robert A. Pucel It is certified that error appears in the above-identified patent and that said Letters Patent is hereby corrected as shown below:

Column 17, line 13, delete "of".

Signed and Sealed this

Thirtieth Day of August, 1988

Attest:

Attesting Officer

DONALD J. QUIGG

Commissioner of Patents and Trademarks